United States Patent [19]

Hashimoto et al.

[11] Patent Number: 5,610,371
[45] Date of Patent: Mar. 11, 1997

[54] ELECTRICAL CONNECTING DEVICE AND METHOD FOR MAKING SAME

[75] Inventors: Kaoru Hashimoto; Tatuo Chiyonobu; Kyoichiro Kawano; Koji Watanabe; Masato Wakamura; Joe Yamaguchi, all of Kawasaki, Japan

[73] Assignee: Fujitsu Limited, Kawasaki, Japan

[21] Appl. No.: 403,678

[22] Filed: Mar. 14, 1995

Related U.S. Application Data

[63] Continuation-in-part of Ser. No. 277,992, Jul. 20, 1994.

[30] Foreign Application Priority Data

| | | | |
|---|---|---|---|
| Mar. 15, 1994 | [JP] | Japan | 6-043445 |
| Sep. 19, 1994 | [JP] | Japan | 6-223787 |
| Feb. 27, 1995 | [JP] | Japan | 7-038142 |

[51] Int. Cl.⁶ ............................... H05K 1/18
[52] U.S. Cl. .................. 174/262; 174/257; 361/760; 361/778
[58] Field of Search ............... 174/262, 263, 174/264, 260, 261, 257, 259; 361/760, 777, 778

[56] References Cited

U.S. PATENT DOCUMENTS

| | | | |
|---|---|---|---|
| 3,007,997 | 11/1961 | Panariti | 174/68.5 |
| 3,955,017 | 5/1976 | Colebourne et al. | 427/383 |
| 3,992,468 | 11/1976 | Cosyns et al. | 260/672 R |
| 4,562,587 | 12/1985 | Gerkema et al. | 378/133 |
| 4,642,889 | 2/1987 | Grabbe . | |
| 4,706,167 | 11/1987 | Sullivan . | |
| 4,950,560 | 8/1990 | Taroy | 429/27 |
| 4,950,843 | 8/1990 | Hirola . | |
| 4,963,002 | 10/1990 | Tagusa et al. . | |
| 5,017,738 | 5/1991 | Tsuji et al. . | |
| 5,088,007 | 2/1992 | Missete . | |
| 5,219,639 | 6/1993 | Sugawara et al. . | |
| 5,243,638 | 9/1993 | Wang et al. | 378/119 |
| 5,317,618 | 5/1994 | Nakahara et al. | 378/161 |
| 5,340,947 | 8/1994 | Credle et al. | 174/262 |
| 5,505,996 | 4/1996 | Nagayama | 427/123 |
| 5,522,535 | 6/1996 | Ivanov | 228/122.1 |

FOREIGN PATENT DOCUMENTS

| | | |
|---|---|---|
| 60-116193 | 6/1985 | Japan . |
| 60-115696 | 6/1985 | Japan . |
| 2-159047 | 6/1990 | Japan . |
| 3-276750 | 12/1991 | Japan . |
| 4-12588 | 1/1992 | Japan . |
| 5-74503 | 3/1993 | Japan . |
| 5-190219 | 7/1993 | Japan . |
| 5-267035 | 10/1993 | Japan . |

OTHER PUBLICATIONS

IBM Technical Disclosure Bulletin, Paste–Encapsulated Terminal, J. R. Petrozello, vol. 21, No. 11, Apr. 1979, pp. 4444–4445.

*Primary Examiner*—Laura Thomas
*Attorney, Agent, or Firm*—Armstrong, Westerman, Hattori, McLeland & Naughton

[57] ABSTRACT

An electrical connecting device including a first circuit board providing thereon with input/output terminals, each of the terminals having a tip surface coated with gallium and a second circuit board providing thereon with contact terminals, each of the terminals having a tip surface coated with indium or tin. A low-melting point alloy layer is formed by a mutual action between gallium and indium or tin, when the input/output terminals of the first circuit board are in contact with the respective terminals of the second circuit board and the terminals are electrically connected to each other. The second metal layer includes a plurality of wire-like metal supports extending substantially perpendicular to the surface of the terminal and a low-melting point metal retained by the wire-like metal supports.

12 Claims, 11 Drawing Sheets

33   32

34   35

CONDUCTIVE FLUID

Ga-Sn LIQUID METAL

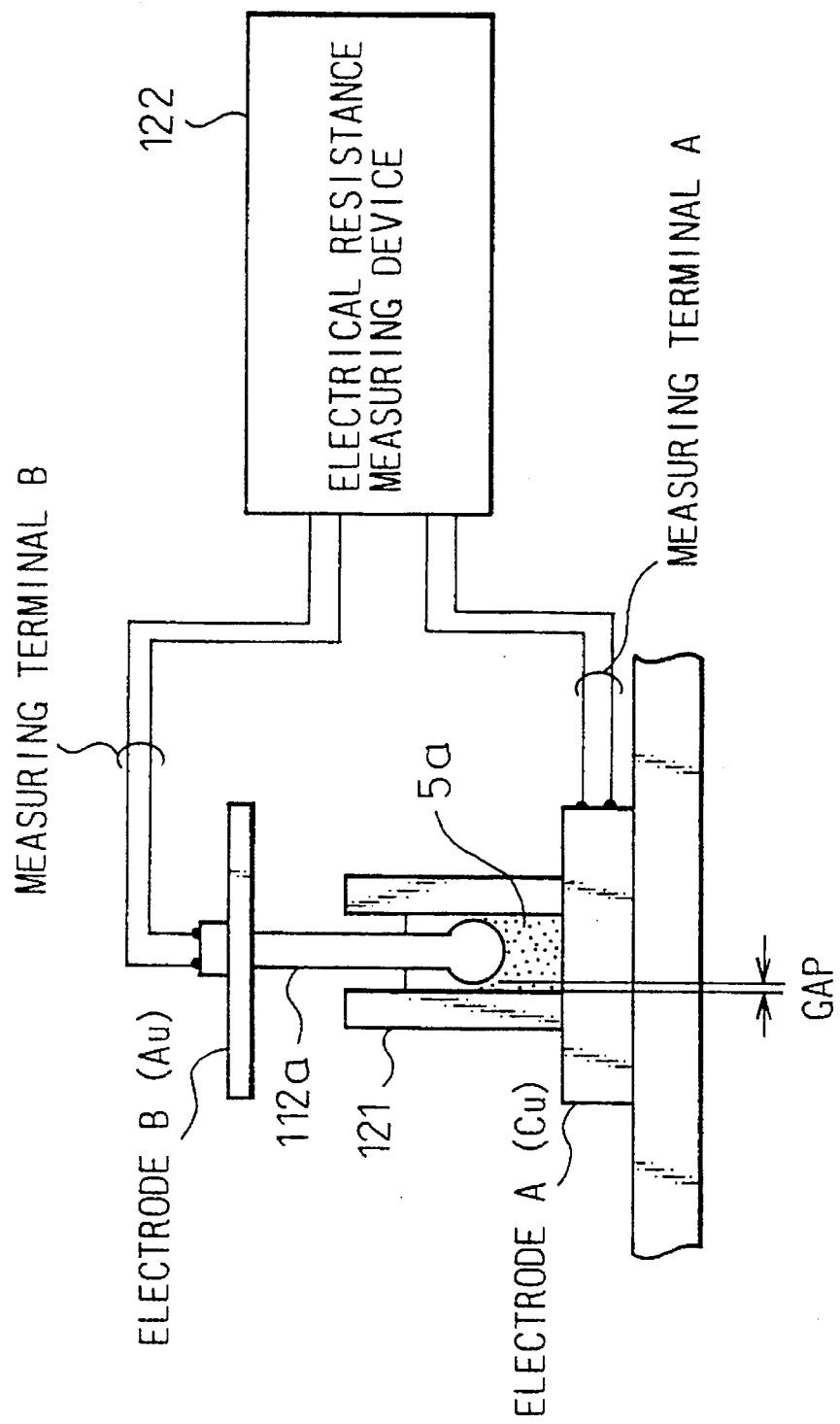

ELECTRICAL CONNECTING DEVICE AND METHOD FOR MAKING SAME

BACKGROUND OF THE INVENTION

This application is a Continuation-In-Part Application of U.S. application Ser. No. 08/277,992 filed on Jul. 20, 1994 and now pending.

1. Field of the Invention

The present invention relates to an electrical conductor and more particularly relates to such an electrical conductor which can be advantageously used when a circuit board having a number of very fine electrical contacts in a small space should be electrically contacted to another circuit board having corresponding electrical contacts. Also, the present invention relates to an electrical connecting device, and an electrical circuit device using such conductors, in which compact, high density and low contact resistance connections can be achieved without the necessity of a special force for inserting or removing the circuit boards to or from each other, when they are electrically connected.

2. Description of Related Art

A conventional electrical connecting device comprises a resilient member (jack) referred to as "a female contact" (Reference: R. F. Bonner et al., IBM J. Research and Development, vol. 26, No. 3, May 1982, PP 297 to 305), and in this type electrical connecting device, a contact pin array (plug) referred to as "a male contact" provided on a circuit board is inserted into the female contact so that both contacts are electrically connected with each other.

In this electrical connecting device, when the plug is inserted into the jack, an electrical connection by metal-to-metal contact can be attained due to the mechanical friction between both members. Although the force exerted by the spring depends on the surface treatment layer on each member, the force is designed so that it is at least several tens of grams to obtain low and stable contact resistance.

In recent years, in order to obtain smaller size and high performance electronic apparatus, a mounting technique has been widely used such that a plurality of elements, such as highly integrated LSIs, chip capacitors, or chip resistors, are mounted on a single circuit board. In these circuit boards, the number of input/output terminals for a single circuit board has been significantly increased. Such input/output terminals are, in general, contact pins (corresponding to plugs) which are fixed to the board by blazing or soldering. Therefore, when these plurality of contact pins are inserted into the jacks or withdrawn from the jacks, a large amount of force is necessary. At most, more than 100 kg is necessary and, therefore, manually handling is sometimes difficult, the contact pins may be bent, or the blazed or soldered portion may be damaged.

In order to reduce the insertion and withdrawal force of the contact pin to overcome the problems, an electrical connecting device using an auxiliary means such as a cam actuation mechanism has been recently developed and employed (Reference: IBM Research and Development, vol. 26, No. 3, May 1982, PP 318 to 327).

However, in these electrical connecting devices, the construction is very complicated, and the space necessary for such a cam actuation mechanism cannot be ignored. Therefore, the packaging efficiency of the entire system may be reduced. As the dimensions of electrical connecting terminals are further reduced, these problems will become more serious.

In order to overcome the above problems, a conductive fluid in which a powder of palladium or copper is dispersed in silicone oil or the like liquid is used as the material of the electrical contact, and the conductive fluid is put into fine containers so as form an electrical connecting device (Reference: IBM Technical Disclosure Bulletin, vol. 21, No. 11, April 1979, Pages 4444 to 4445). Due to the foregoing construction, an auxiliary means such as a cam actuation mechanism becomes unnecessary, however, it is still impossible to provide a satisfactorily low electrical contact resistance. Therefore, realization of an electrical contact device capable of providing a low 10 electrical contact resistance is desired.

Recently, a technique has been disclosed, in which liquid metal is used for the electrical connecting conductor to connect terminals. For example, according to Japanese Unexamined Patent Publication (Kokai) No. 5-190219, oxide powder is dispersed in liquid metal to adjust the viscosity for preventing the liquid metal from scattering. In this case, oxidization of the liquid metal is unavoidable.

Further, according to Japanese Unexamined Patent Publication (Kokai) No. 5-74503, in order to prevent oxidization of the liquid metal, the connecting section of each terminal is coated with the liquid metal, and further the surface of the liquid metal that has been coated on each terminal is coated with liquid high polymer. However, this construction is disadvantageous in that the liquid metal is released from the terminals when they are contacted with each other, and when liquid highly polymerized compound is interposed between the liquid metals, the stability of the electrical resistance cannot be maintained.

SUMMARY OF THE INVENTION

The present invention has been achieved in view of the above problems of the conventional examples. An object of the present invention is to provide an electrical connecting conductor, an electrical connecting device and an electrical circuit device characterized in that: an insertion and withdrawal force is not required; a connecting terminal provided for very fine semiconductor elements which are very densely assembled can be connected; and the electrical contact resistance can be further reduced.

The above object can be accomplished by an electrical connecting conductor for electrically connecting different terminals, and the electrical connecting conductor comprises a conductive fluid in which a liquid metal and an organic liquid are stirred and the particulate liquid metal is mixed with the organic liquid.

It is preferable that the liquid metal is a Ga—Sn alloy, and more preferable that the liquid metal is a Ga—Sn alloy having the eutectic composition of 92.0 wt % of Ga and 8.0 wt % of Sn.

It is also preferable that the liquid metal is a Ga—In alloy, and more preferable that the liquid metal is a Ga—In alloy having the eutectic composition of 75.5 wt % of Ga and 24.5 wt % of In.

It is further preferable that the organic liquid is perfluorocarbon, silicone oil or hydrocarbon oil.

According to the electrical connecting conductor of the present invention, dispersed fine particles of the liquid metal are contacted with each other in the organic liquid. Therefore, resistance of the conductive fluid itself is reduced, so that the connecting terminal can be stably communicated with the connecting section.

The anti-corrosion property of the liquid metal is generally low. Therefore, the liquid metal is easily subjected to oxidization and hydroxidization. However, according to the electrical connecting conductor of the present invention, the liquid metal is shielded from the outside air when the liquid metal is dispersed in the organic liquid. Accordingly, it is possible to prevent oxidization and hydroxidization of the liquid metal.

The object of the present invention can also be accomplished by an electrical connecting device comprising a cylindrical connecting section provided with a bottom in which the conductive fluid is accommodated, and the cylindrical connecting section is electrically connected with an inserted connecting terminal through the conductive fluid.

According to the electrical connecting device of the present invention, the connecting terminal is inserted into the cylindrical connecting section having the bottom in which the conductive fluid is accommodated, and the cylindrical connecting section is electrically connected with the connecting terminal through the conductive fluid. Therefore, the insertion and withdrawal force is substantially zero.

Since fine particles of the liquid metal is dispersed in the conductive fluid to cover a periphery of the connecting terminal, the contacting surface area is increased as compared with that of the conventional mechanical connecting system or compared with that of the conductive fluid in which metallic powder is dispersed. As a result, even if very fine connecting terminals are used, a stable electrical connection can be provided.

The present invention is to further provide an electrical circuit device in which a connecting terminal on the circuit board is inserted into a cylindrical connecting section having a bottom, the conductive fluid being accommodated in the cylindrical connecting section, wherein the interval between the outer circumferential surface of the connecting terminal dipped in the conductive fluid and the inside wall of the connecting section is at least 10 to 100 μm.

It is preferable that a fore end of the connecting terminal dipped in the conductive fluid in the connecting section is spherical, and the width of the connecting terminal is the maximum at the fore end.

Also, it is preferable that the fore end of the connecting terminal dipped in the conductive material in the connecting section is thin, and an intermediate portion of the connecting terminal dipped in the conductive material is thick.

In the electrical circuit device of the present invention, the minimum interval between the outer circumferential surface of the connecting terminal dipped in the conductive fluid and the inside wall of the connecting section is not more than 10 to 100 μm.

Consequently, when the connecting terminal is inserted into the connecting section, the connecting terminal is lowered so that it is contacted with the conductive fluid and pressure is applied to the connecting terminal. Since a gap formed between the connecting terminal and the side wall of the inside connecting section is small, the upward movement of the conductive fluid is restricted, so that pressure is given to the conductive fluid. Therefore, fine particles of the liquid metal contained in the organic liquid are pushed downward, and the density is increased on the lower side. When pressure is further given to the connecting terminal, movement of the conductive fluid is restricted by the small gap, however, when the pressure is applied, the pressure given to the conductive fluid is increased. Accordingly, organic liquid having a high fluidity mainly flows out from the gap, and the connecting terminal is inserted into the conductive fluid.

When the connecting terminal being given pressure is inserted and finally stops in the connecting section, the conductive fluid containing highly dense fine particles of the liquid metal is thus interposed between the small gap portion and the bottom of the connecting section.

In order to form a small gap between the outer circumferential surface of the connecting terminal and the side wall inside the connecting section, the fore end of the connecting terminal may be made thicker than other portions, for example, the fore end of the connecting terminal may be made to be spherical. In this case, the conductive fluid containing highly dense fine particles of the liquid metal exists at a lower position of the connecting terminal. Alternatively, the fore end may be made to be thin, and the intermediate portion may be made to be thick. In this case, the fore end portion is inserted into the conductive fluid containing fine particles of the liquid metal. Due to the foregoing, the conductivity between the connecting terminal and the connecting section is further enhanced, and the connecting resistance is further reduced.

[1] A method of making the electrical connecting conductor composed of the conductive fluid of the present invention will be explained below.

As the electrical connecting conductor of the present invention, a conductive fluid is used, in which the liquid metal and organic liquid are stirred so that fine particles of the liquid metal are mixed with the organic liquid. The types of the liquid metal and the organic liquid and their combinations are shown as follows.

(A) Types of the liquid metal and the organic liquid

Examples of usable liquid metals are described as follows.

(1) Ga—Sn liquid metal having the eutectic composition of 92.0 wt % of Ga and 8.0 wt % of Sn (2) Ga—Sn liquid metal having the composition of not less than 92.0 wt % of Ga and not more than 8.0 wt % of Sn (3) Ga—Sn liquid metal having the composition of not more than 92.0 wt % of Ga and not less than 8.0 wt % of Sn (4) Ga—In liquid metal having the eutectic composition of 75.5 wt % of Ga and 24.5 wt % of In (5) Ga—In liquid metal having the composition of not less than 75.5 wt % of Ga and not more than 24.5 wt % of In.

Examples of usable organic liquids are described as follows.

(a) Perfluorocarbon (1) FLUORINERT (2) KRYTOX (lubricating oil of fluorocarbon)

(b) Silicone oil (c) Hydrocarbon (B) Examples of usable combinations of liquid metal and organic liquid (i) Ga—Sn and perfluorocarbon having the composition of (1), (2) or (3)

(ii) Ga—Sn and silicone oil having the composition of (1), (2) or (3)

(iii) Ga—Sn, silicon oil and hydrocarbon having the composition of (1), (2) or (3)

(iv) Ga—In and perfluorocarbon having the composition of (4) or (5)

(v) Ga—In and silicone oil having the composition of (4) or (5)

(vi) Ga—In, silicone oil and hydrocarbon having the composition of (4) or (5)

BRIEF DESCRIPTION OF THE DRAWINGS

FIG. 11 is an arrangement view of the measuring device for explaining the measuring method for electrical connecting resistance of the electrical circuit device of the example of the present invention;

DETAILED DESCRIPTION OF THE PREFERRED EMBODIMENTS

Figure 1A:
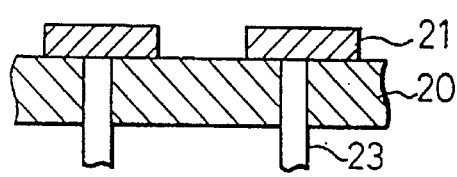
FIGS. 1(a) through 1(f) show respective steps for forming an electrical connecting device according to the first embodiment of this invention.
Figure 1D:
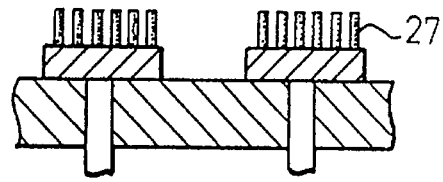
Figure 1B:
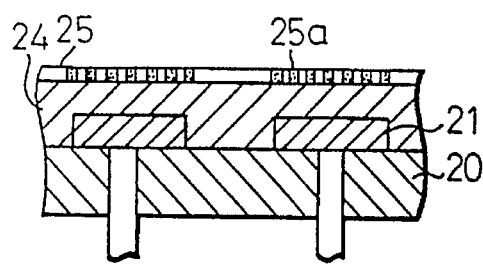
Figure 1E:
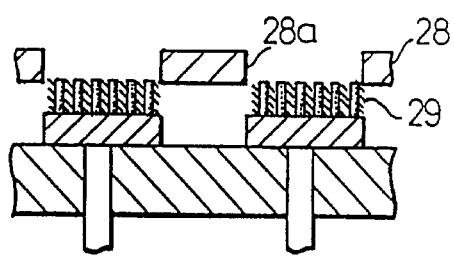
Figure 1C:
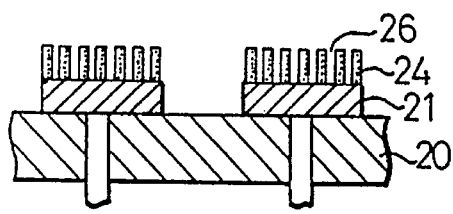
Figure 1F:
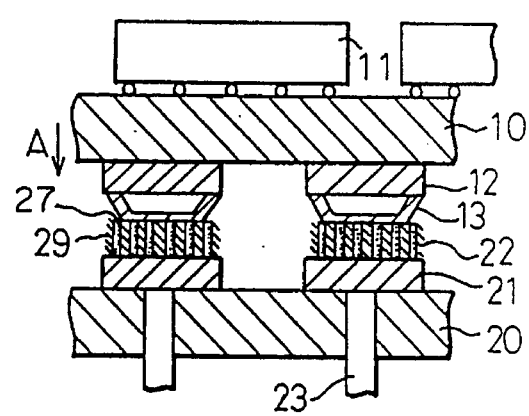

Referring now to the accompanying drawings, FIGS. 1(a) through 1(f) show the respective steps for forming an electrical connecting device according to the first embodiment of this invention. In FIG. 1(f), a first circuit board 10 is provided on the upper surface thereon with an electrical element 11, such as a LSI (large-scale integrated circuit) chip 11 of a semiconductor device, by means of any known method. On the lower surface of the circuit board 10 is provided with input and output terminals 12, each having a tip end coated with a film 13 of gallium by a method such as vapor deposition.

On the other hand, a second circuit board or connecting board 20 is provided on the upper surface thereof with connecting terminals 21 which are arranged in conformity with the input and output terminals 12 of the first circuit board 10 so that the terminals 21 are to be electrically connected to the respective terminals 12 of the first circuit board 10. A metal coating film 22 consisting of indium or tin is formed on the surface of the respective terminals 21 by means of a method as will be mentioned such as mentioned below.

Thus, if the first circuit board 10 is moved downward as shown by an arrow A, the input/output terminals 12 of the first circuit board 10 come into contact with the respective terminals 21 of the second circuit board 20 and are electrically connected thereto. As discussed hereinafter more detail, the gallium film 13 and the metal coating film 22 made of indium or tin are mutually contact therewith and cooperate to generate a low-melting point alloy layer by mutually acting therebetween. Thus, the both terminals 12 and 21 are electrically connected to each other via the low-melting point alloy layer.

Figure 2:
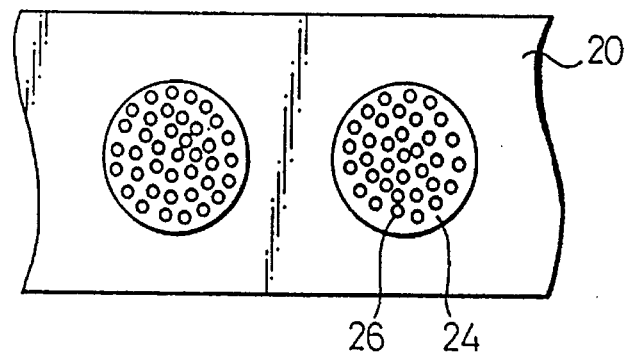
FIG. 2 is a plan view seen from the top of FIG. 1(c)

The metal coating film 22 made of indium or tin formed on the surface of the terminal 21 of the second circuit board 20 is formed by a method as shown in FIGS. 1(a) through 1(e). First of all, as shown in FIG. 1(a), a plurality of terminals 21 are formed on the second circuit board 20 by any known method and leads 23 are attached to the board 20 so as to pass through the board 20 and contact with the terminals 21. In FIG. 1(b), the surface of the second circuit board 20 containing the terminals 21 is coated with (positive) photoresist to a predetermined thickness thereof. A photo-mask 25 having a plurality of exposed portions 25a at the areas corresponding to the terminals 21 is placed on the top of this photoresist 24. Then, the photoresist is exposed to pattern exposure of light or high energy beam, such as electron beam or ray. The diameter of the exposed portions 25a is 50 μm and the pitch therebetween is 80 μm. Thus, the photoresist 24 only on the exposed portions 25a are removed and the photoresist 24 on the other unexposed portions are remained. Therefore, a pattern of holes 26 having the diameter thereof being 50 μm and the pitch therebetween being 80 μm are formed, as shown in FIGS. 1(c) and 2.

The second circuit board 20 is dipped into the electroless nickel plating bath (not shown in the drawings) and a flow of plating liquid toward the second circuit board 20 is created in the bath, so that the nickel plated layer 27 is grown within the plurality of holes 26. Then, if the photoresist 24 is removed or peeled off, a large number of terminals 27 of the wire-like grown plated nickel are obtained, as shown in FIG. 1(d). Then, indium is vapor-deposited onto the second circuit board 20, using a mask 28 having openings 28a arranged at positions corresponding to the positions of the wire-like grown plated nickel 27, as shown in FIG. 1(e). Thus, a large number of nickel wires 27 can be inserted in the indium.

Then, as mentioned above, as shown in FIG. 1(f), the gallium films 13 formed on the input/output terminals 12 of the first circuit board 10 come into contact with the metal coating layers 22 in which indium 29 is retained by a number of nickel wires 27, so that liquid phases of Ga—In are created and thus both terminals 12 and 21 are electrically connected to each other.

The amount of indium 29 is calculated by reducing the volume of the nickel wires 27 from the volume of the openings 28a of the mask 28. A predetermined amount of indium thus calculated should be filled in the crucible of a vapor-deposition apparatus (not shown) and all of the indium in the crucible is completely evaporated, so that the amount of indium can be regulated. On the other hand, the amount of gallium is determined automatically, if the amount of indium is determined. For example, if an eutectic composition should be obtained, the amount of gallium being 75.5 weight percent and the amount of indium being 24.5 weight percent. Thus, the gallium is adhered to the terminals by vaporizing, sputtering or the like. Tin can also be used in place of indium 29 and tin-films can be formed in the same manner as the above. In this case, the same effects can also be obtained. However, in this case, the amounts of indium and tin should be determined in such a manner that an eutectic composition should be obtained, wherein the amount of gallium being 92 weight percent and the amount of tin being 8 weight percent.

Figure 3A:
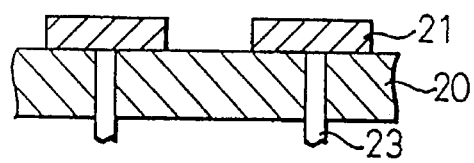
FIGS. 3(a) through 3(e) show respective steps for forming an electrical connecting device according to the second embodiment of this invention.
Figure 3B:
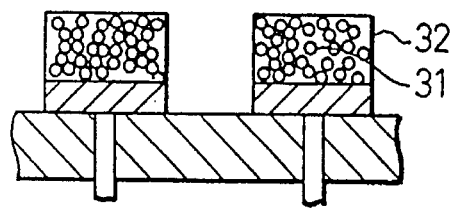
Figure 3C:
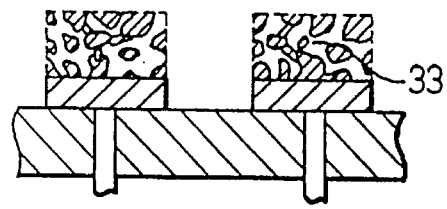
Figure 3D:
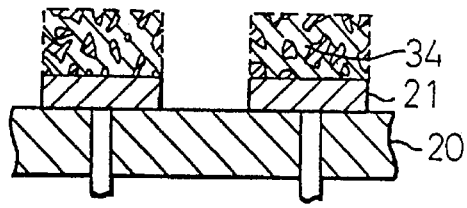

FIGS. 3(a) to 3(e) show a process of the second embodiment of a method for making an electrical connecting apparatus according to the present invention. First of all, FIG. 3(a) a second circuit board 20 having a plurality of connecting terminals 21 and lead terminals 23 in the same manner as FIG. 1(a). In FIG. 3(b), a predetermined thickness of photoresist 32 in which paraffin 31 is dispersed is coated on the surface of the portions of the terminals 21 of the second circuit board 20. Then, the photoresist 32 is baked. As shown in FIG. 3(c) and enlarged view of FIG. 4, the paraffin 31 becomes to be melted to form a plurality of apertures (or cavities) 33. Thus, the amount of paraffin should be adjusted in advance in such a manner that these apertures are mutually communicated with each other.

The second circuit board 20 is dipped into the electroless nickel plating bath (not shown in the drawings) and a flow of plating liquid toward the surface of the terminals 21 of the second circuit board 20 is created in the bath, so that the nickel plated layer 34 is grown within the plurality of apertures 33 mutually communicated with each other. Then, if the photoresist 32 is removed or peeled off, a large number of terminals 34 of the plated nickel are obtained to form a net-like or three-dimensional configuration.

Figure 5:
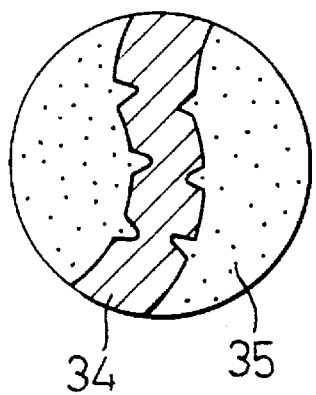
FIG. 5 is a partial enlarged view of FIG. 3(d)

Although not illustrated in the drawings, in the same manner as the first embodiment, indium 35 is evaporated to the second circuit board 20, using a mask 28 having openings 28a arranged at positions corresponding to the positions of the plated nickel, as shown in FIG. 1(e). Thus, as shown in the enlarged view of FIG. 5, indium 35 is retained on the net-like plated nickel 34.

Figure 3E:
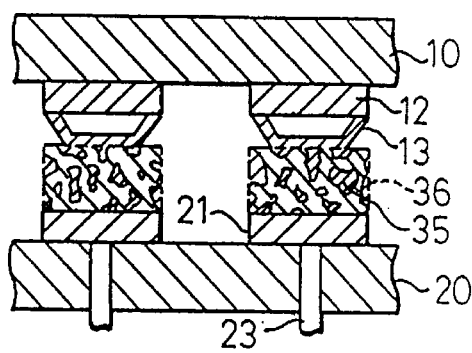
Figure 4:
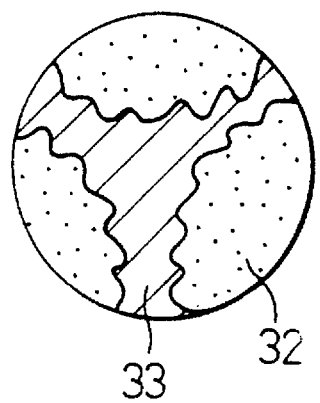
FIG. 4 is a partial enlarged view of FIG. 3(c)

Then, in the quite same manner as the above-mentioned first embodiment, as shown in FIG. 3(e), the gallium films 13 formed on the input/output terminals 12 of the first circuit board 10 come into contact with the metal coating layers 36 in which indium 35 is retained by the plated nickel 34, so that liquid phases of Ga—In are created and thus both terminals 12 and 21 are electrically connected to each other, in the same manner as the above embodiment.

In an alternative embodiment, it is possible to relatively simply and directly obtain terminals in which plated nickel exists net-like configuration by electroless plating using an electroless plating liquid containing paraffin dispersed on the portions of the pattern or terminal 21 of the second circuit board 20. In the same manner as the second embodiment, by heating the second circuit board 20, the paraffin is melted and removed and then, in place of paraffin, indium or tin is attached thereto by vapor-deposition.

Also, as a method for adhering indium or tin, in place of vapor-deposition, an electro-plating method can also be used. In this case, however, it is necessary that the respective terminals are electrically connected to each other.

According to the above-mentioned embodiments, it is possible to easily obtain the metal coated layer in which a liquid phase of eutectic alloy can be created by mutually contacting with respect to each other and an electrical connecting device in which the metal plated layer is stably retained on the connecting terminals 21. Thus, when the terminals 12, 21 of the first and second circuit boards 10, 20 are to be mutually connected to each other, it is possible to greatly reduce the force for manually inserting or removing the input/output terminals.

According to another aspect of the present invention, there is provided an electrical connecting device comprising: a first circuit board providing thereon with (protruded) input/output terminals; a second circuit board providing with holes at positions corresponding to said (protruded) input/output terminals of said first circuit board, each of said holes having a bottle shape in which the cross-sectional area thereof at an internal side is larger than that at an open-end thereof; and conductive material filled in each of said holes, wherein said first and second circuit boards are electrically connected to each other by inserting said (protruded) input/output terminals of said first circuit board into the respective holes of said second circuit board.

Since the hole in which conductive material is filled has such a bottle shape that the cross-sectional area thereof at an internal side is larger than that at an open-end thereof. Therefore, the conductive material can be safely kept within the hole and cannot easily spilled or scattered out of the hole. Thus, a reduction of conductive material can be prevented.

According to still another aspect of the present invention, there is provided a method of making an electrical connecting device, said device comprising a first circuit board providing thereon with (protruded) input/output terminals, a second circuit board providing input/output terminals of said first circuit board, and conductive material filled in each of said holes, wherein said first and second circuit boards are electrically connected to each other by inserting said (protruded) input/output terminals of said-first circuit board into the respective holes of said second circuit board; said method comprising:

forming said second circuit board or at least portions thereof around which said holes with photosensitive polymer; and etching (or developing) or photolithography said second circuit board to form holes thereon, each of said holes having a bottle shape in which the cross-sectional area thereof at an internal side is larger than that at an open-end thereof.

The hole in which conductive material should be filled is formed by photo or photolithography etching the photosensitive polymer. Therefore, a hole or through-hole having such a bottle shape, that the cross-sectional area thereof at an internal side is larger than that at an open-end thereof, can easily be obtained.

Next, with reference to FIGS. 6(a) and 6(b), a method of making the electrical connecting conductor composed of the conductive fluid of the example of the present invention will be explained as follows.

In this example, Ga—Sn alloy having the eutectic composition was used as the liquid metal, and two types of perfluorocarbon (brand name: FC-40 and FC-71) were used as the organic liquid, wherein one type of perfluorocarbon has a low viscosity, and the other type of perfluorocarbon has a high viscosity. In this connection, FC-40 and FC-71 are liquid at a normal temperature, and their boiling points are respectively 56° C. and 156° C.

In order to investigate the dependency of the resistance of the conductive fluid with respect to the content of the liquid metal, a mixing ratio of the liquid metal to the organic liquid was variously changed.

Figure 6A:
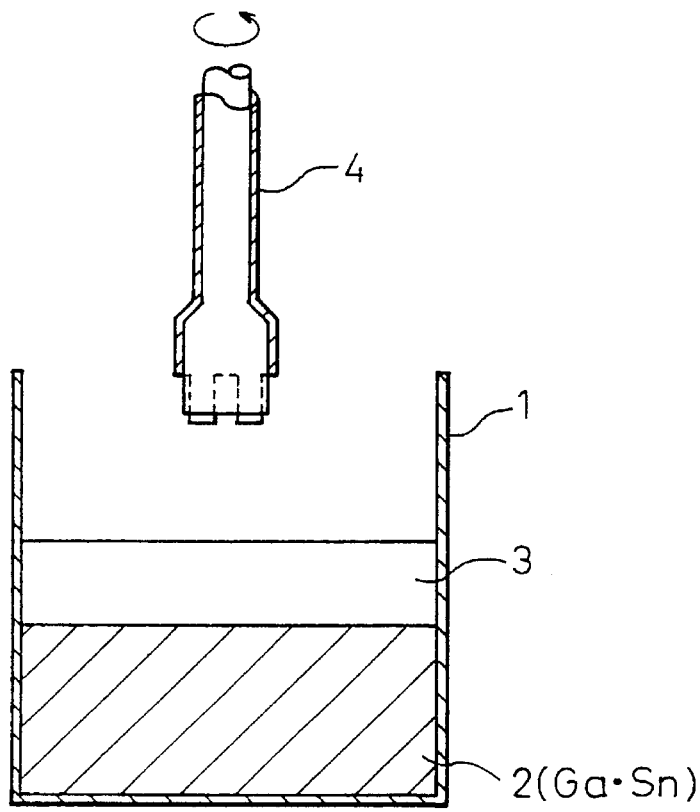
FIGS. 6(a) and 6(b) are side views showing a method of making the conductive fluid of the example of the present invention.

First, as illustrated in FIG. 6(a), a predetermined quantity of Ga—Sn alloy (liquid metal) 2 and a predetermined quantity of perfluorocarbon (organic liquid) 3 were put into the same container 1. In this condition, it is necessary to determine the composition of Ga—Sn so that the Ga—Sn alloy can be maintained in a melting condition at the room temperature.

Figure 6B:
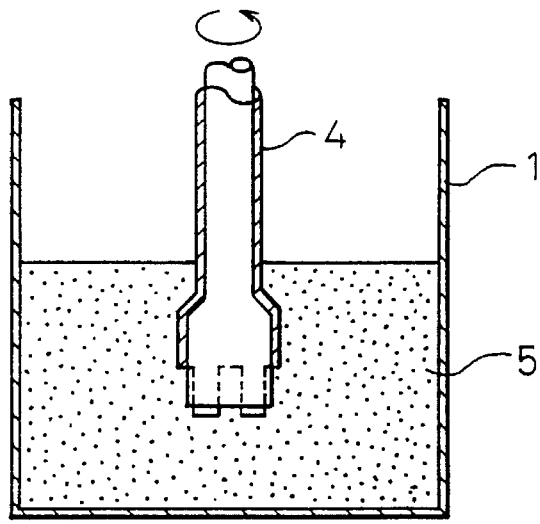

Next, as illustrated in FIG. 6(b), a homogenizer (agitator) 4 was inserted into the mixed liquid, and then the mixed liquid was stirred at a speed of 10000 to 20000 rpm. Due to the foregoing, the liquid metal 2 was changed into a fine particle condition and mixed with the organic liquid 3. In this way, a conductive fluid 5 was made.

Resistance of the thus obtained conductive fluid 5 was measured. Results of the measurement are shown on FIG. 7. The measurement of resistance was carried out in the following manner:

A pair of electrodes were inserted into the conductive fluid 5, and a voltage was applied upon the two electrodes. Under the above condition, a current flowing between the electrodes was measured, and the measured current was converted to a value of resistance. The pair of electrodes were composed of disks made of copper, the diameter of which was 2 cm, and the thickness of which was 1 cm, wherein the pair of electrodes were opposed to each other at an interval of 20 to 30 μm.

Figure 7:
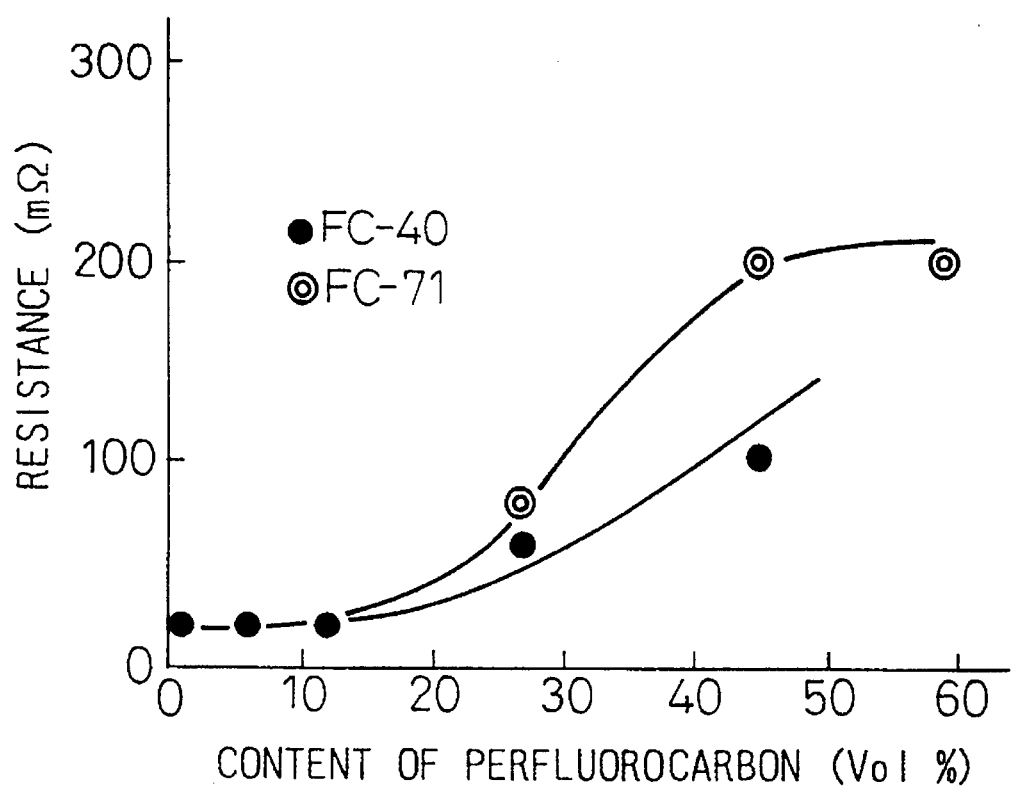
FIG. 7 is a diagram showing a characteristic of the resistance of the conductive fluid of the example of the present invention, which resistance being dependent on the organic liquid containing ratio.

In FIG. 7, the vertical axis represents a value of resistance (mΩ) indicated by the proportional gradation, and the horizontal axis represents a content (%) of per fluorocarbon indicated by the proportional gradation.

The results are described as follows:

When low viscous perfluorocarbon (FC-40) was used, the resistance was constant and it was approximately 20 mΩ under the condition that the content of perfluorocarbon was not more than 20 vol %. However, when the content of perfluorocarbon exceeded 20 vol %, the resistance gradually increased, and when the content of perfluorocarbon exceeded 45 vol %, the resistance was increased to a value not less than 100 mΩ, which is not desirable in practical use.

In the case where highly viscous perfluorocarbon (FC-71) was used, the resistance was approximately 20 mΩ under the condition that the content of perfluorocarbon was not more than 10 vol %. However, when the content of perfluorocarbon exceeded 10 vol %, the resistance gradually increased. When the content of perfluorocarbon exceeded 30 vol %, the resistance was increased to a value not less than 100 mΩ, which is not desirable from the view point of practical use. Further, when the content of perfluorocarbon exceeded 45 vol %, the resistance increased to approximately 220 mΩ.

As described above, according to the conductive fluid of the example of the present invention, it is possible to maintain the resistance to be not more than 100 mΩ when the content of the liquid metal 2 is not less than an appropriate value. This resistance is smaller than the resistance provided when metallic powder is dispersed in organic liquid.

The reason is considered as follows:

When the liquid metal 2 is used, as compared with a case in which metallic powder is dispersed in organic liquid, an area of the contact surface between the liquid metal 2 and the electrode is increased. Further, when the fine particles of the liquid metal 2 are stirred and mixed, they are contacted with each other in the perfluorocarbon 3, so that the resistance of the conductive fluid 5 itself is reduced and a stable electrical communication can be provided between the pair of electrodes.

Further, according to the example of the present invention, the liquid metal 2 and the perfluorocarbon 3 are mixed and stirred. Therefore, the fine particles of the liquid metal 2 is uniformly mixed with the perfluorocarbon 3, so that the fine particles of the liquid metal 2 are coated with the perfluorocarbon 3. Consequently, the fine particles of the liquid metal 2 are not contacted with the outside air, and oxidization and hydroxidization of the liquid metal 2 can be prevented, so that the resistance can be maintained to be low.

Next, a test was made, in which the aforementioned conductive fluid 5 was left for 120 hours in an atmosphere of high temperature and high humidity, the temperature of which was 60° C., and the relative humidity of which was 90% RH.

After the test, the resistance of the sample was measured again. The measuring method was the same as that described before. According to the result of the measurement, the resistance between the outer terminal 112 and the connecting terminal 116 or 117 (FIG. 9(c)) was not increased with the lapse of time.

Appearance of the conductive fluid 5 was subjected to visual inspection after the test, and further the conductive fluid 5 was analyzed by means of XPS (X-ray photoelectron spectrophotometry). In order to make a comparison, only the liquid metal of Ga—Sn was exposed to an atmosphere of high temperature of 60° C. and high humidity of 90% RH, and thus obtained samples were subjected to the same appearance inspection and analysis. A reference sample made of liquid metal of Ga—Sn was tested by means of XPS, and the result of analysis is also shown here.

Figure 8A:
FIGS. 8(a) and 8(b) are plan views showing the result of observation of the conductive fluid of the example of the present invention after the completion of a test of high temperature and humidity.
Figure 8B:
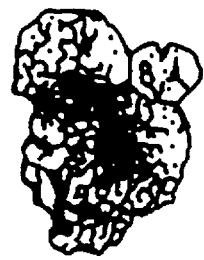

FIG. 8(a) shows the result of the observation of appearance of the conductive fluid of the invention. FIG. 8(b) shows the result of the observation of appearance in the comparative example. Table 1 shows the result of analysis.

TABLE 1

|  | Sample | Detected electron orbit | Position of peak (eV) | Identification substance |
|---|---|---|---|---|
| Reference | Ga—Sn liquid metal | Ga2P | 1119.1 | $Ga_2O_3$ |
| After test | Ga—Sn + FC | Ga2P | 1119.5 | $Ga_2O_3$ |
|  | Ga—Sn liquid | Ga2P | 1121.2 | GaOOH, $Ga(OH)_3$ |

According to FIGS. 8(a) and 8(b) showing the result of the observation of appearance, in the case of the conductive fluid 5 of this example, the configuration is formed to be substantially spherical by the action of surface tension and the conductive fluid 5 is in a liquid (fluid) condition. On the other hand, in the case of Ga—Sn liquid metal, the configuration is not constant and solidified.

According to Table 1 in which the result of analysis is shown, in the case of the conductive fluid 5 of the example of the present invention, the peak position of energy of electrons emitted from the sample surface is 1119.5 eV. Accordingly, existence of $Ga_2O_3$ was confirmed. It is very close to the peak position 1119.1 eV of the liquid metal of Ga—Sn which is a reference sample. On the other hand, in the case of the comparative example, the peak position is 1121.2 eV. Therefore, existence of GaOOH and $Ga(OH)_3$ was confirmed. In the case of the conductive fluid 5 of the example, oxidization of the surface was unavoidable when the conductive fluid 5 was exposed to the atmosphere, so that the oxide was detected, however, oxidization of the inside liquid metal was restricted. The restriction of oxidization was proved by the results of resistance measurement and observation shown on FIG. 8(a). In the case of the comparative example, formation of hydroxide shows that the liquid metal reacted with the moisture in the atmosphere.

Due to the foregoing, the following are shown:

The anti-corrosion property of the liquid metal 2 is low. Accordingly, when the liquid metal 2 is exposed to the atmosphere, it is subjected to oxidization or hydroxidization. However, in the above example, when the Ga—Sn liquid metal 2 is mixed with the perfluorocarbon 3, the Ga—Sn liquid metal 2 is not contacted with the outside air. Therefore, oxidization or hydroxidization of the Ga—Sn liquid metal 2 is inhibited.

In the above example, the experiment was made with respect to the Ga—Sn liquid metal, however, the same experimental result can be obtained by the Ga—In liquid metal.

[2] Explanation of the electrical connecting device of the example of the present invention will be explained below.

Figure 9A:
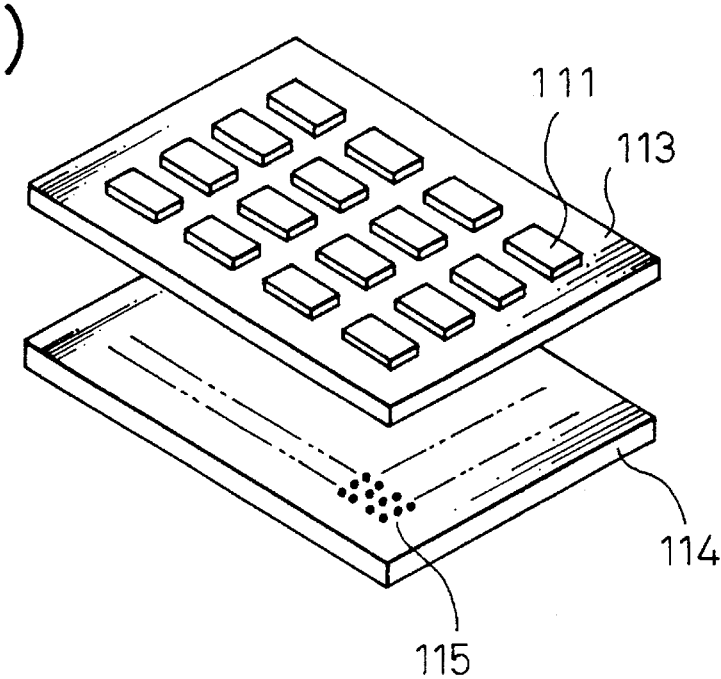
FIG. 9(a) is a perspective view showing the electrical connecting device of the example of the present invention.
Figure 9B:
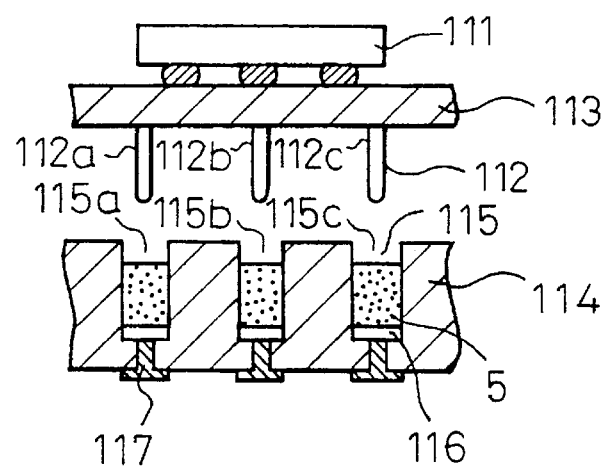
FIGS. 9(b) and 9(c) are sectional views showing the detail of the connecting section.
Figure 9C:
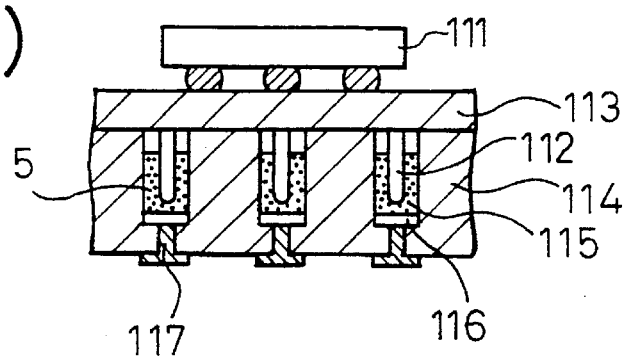

FIG. 9(a) is a perspective view showing the electrical connecting device and the device to be connected according to the example of the present invention. FIGS. 9(b) and 9(c) are sectional views showing the detail of the construction of the connecting section of the above electrical connecting device.

In FIG. 9(a), numeral 111 denotes semiconductor elements (circuit elements) having a large number of input/output terminals, and numerals 113 denotes a ceramic circuit board (device to be connected) on which semiconductor elements 111 are mounted. Numerals 112 denotes connecting terminals.

Numeral 114 denotes a connector base body (electrical connecting device). Numeral 115 denotes recessed connecting sections formed at positions in the connector base body 114 corresponding to the connecting terminals 112 of the ceramic circuit board 113. At the bottom of the recessed connecting section 115, there is provided a connecting thin film layer 116 composed of a conductive thin film. The conductive fluid 5 made in the manner described above is accommodated in the recessed connecting section 115. Numeral 117 is a connecting via electrically connected with the other circuit boards such as a printed circuit board for mother board which is provided at the bottom of the recessed connecting section 115.

With reference to FIGS. 9(b) and 9(c), the connecting operation will be explained below, in which the semiconductor element 111 mounted on the ceramic circuit board 113 by such as controlled collapsed bonding or flit chip bonding is connected with the connector base body 114.

First, in the same manner as that shown in FIGS. 6(a) and 6(b), the Ga—Sn liquid metal 2 having the eutectic composition of 92.0 wt % of Ga and 8.0 wt % of Sn and the perfluorocarbon 3, which is the organic liquid, are put into the same container 1 and stirred, wherein the mixing ratio is determined so that the content of the liquid metal 2 can be 88 to 99 vol %. At this time, the fine particles of the eutectic liquid metal of Ga—Sn 2 are contacted with each other in the perfluorocarbon 3. Accordingly, the resistance of the conductive fluid 5 itself is reduced. In this connection, for example, low viscous FC-40 is used as the perfluorocarbon 3.

Next, a predetermined amount of conductive fluid 5 is put into all recessed connecting sections 115 of the connector base body 114.

Next, the ceramic circuit board 113 on which a semiconductor element 111 is mounted is arranged in such a manner that the connecting terminals 112 (112a, 112b, 112c) of the ceramic circuit board 113 are opposed to the recessed connecting sections 115 (115a, 115b, 115c). Then each connecting terminal 112 is inserted into each connecting section 115. Due to the foregoing, the connecting terminal 112 of the ceramic circuit board 113 is electrically connected with the connecting section 116 or 117 of the connector base body 114 through the conductive fluid 5.

At this time, the conductive fluid 5 is interposed between the connecting terminal 112 and the connecting thin film layer 116 or 117. Therefore, a force required for inserting and withdrawing the connecting terminal 112 is substantially zero. Since the fine particles of the liquid metal in the conductive fluid 5 cover the surfaces of the connecting terminal 112 and the connecting thin film layer 116, the contact area is large. Further the resistance of the conductive fluid 5 itself is low. Therefore, the connecting terminal 112 is stably communicated with the connecting thin film layer 116.

As described above, according to the electrical connecting device of the example of the present invention, the conductive fluid 5 is interposed between the connecting terminal 112 and the connecting thin film layer 116. Therefore, the force required for inserting and withdrawing the connecting terminal 112 is substantially zero. Consequently, even when a large number of connecting terminals 112 and connecting thin film layer 116 are connected with each other, the connecting terminals 112 can be easily inserted into and withdrawn from the recessed connecting sections 115 without being damaged.

Since the connecting section (connecting thin film layer 116, 117 in the recessed section 115) and the connecting terminals 112 are covered with the fine particles of the liquid metal 2 in the conductive fluid 5, the contact area is larger than that of the conventional conductive fluid in which metallic powder is dispersed in an organic liquid. As a result, even if the connecting terminals 112 are very minute, a stable electrical connection can be provided.

Further, the dispersed fine particles of the liquid metal 2 are contacted with each other in the perfluorocarbon 3. Therefore, the resistance of the conductive fluid 5 itself is reduced, so that a stable electrical communication can be provided between the connecting terminal 112 and the connecting thin film layer 116.

Further, when the liquid metal 2 is mixed with the perfluorocarbon 3, the liquid metal 2 is not contacted with the outside air. Accordingly, it is possible to prevent the occurrence of oxidization or hydroxidization. Compared with an example disclosed in Japanese Unexamined Patent Publication No. 5-74503, adjustment of viscosity is seldom required in the example of the present invention so that it can be easily handled. Further, when connecting terminals, the ends of which are coated with the liquid metal, are contacted with each other in this disclosed example, there is a possibility that the liquid of high polymer which coats the liquid metal is interposed between the liquid metal of one contacting terminal and the liquid metal of the other contacting terminal. Due to the foregoing, the resistance may become unstable. However, according to the example of the present invention, this problem can be avoided.

In the above example, the conductive fluid 5 in which the Ga—Sn alloy (liquid metal) 2 and the perfluorocarbon (organic liquid) 3 are combined is used as the electrical connecting conductor. However, it is possible that liquid metals and organic liquids shown in (A) of item [1] are combined as shown in (B) of item [1], and the thus obtained conductor may be used.

In this example, the Ga—Sn liquid metal is used, however, the Ga—In liquid metal may be used in the same manner.

[3] Explanation of the construction of the electrical circuit device of the example of the present invention will be explained below.

Figure 10A:
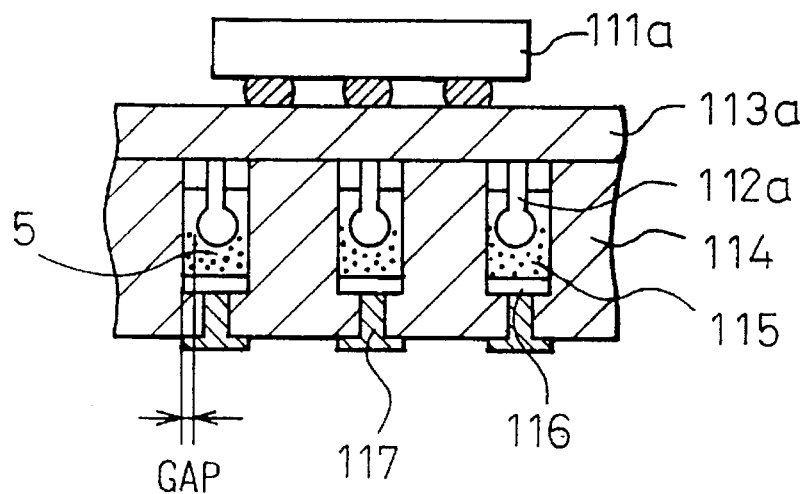
FIGS. 10(a) and 10(b) are sectional views showing the detail of the connecting terminal on the circuit board of the electrical circuit device of the example of the present invention.
Figure 10B:
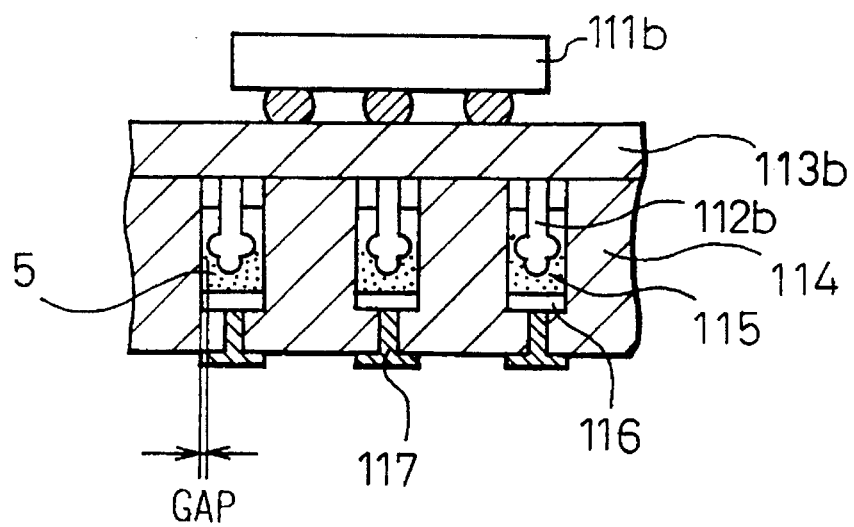

FIGS. 10(a) and 10(b) are sectional views showing the electrical circuit devices of the example of the present invention. In these drawings, two different examples are shown, in which the detailed configurations of the connecting terminals and the inserting conditions of the connecting terminals into the connecting sections are illustrated. These examples include the same electrical connecting device and circuit board as those shown in FIG. 9(a). When these examples are compared with the device shown in FIG. 9(a), the connecting terminals of the circuit boards are different.

In one example, as illustrated in FIG. 10(a), a fore end of the connecting terminal 112a is thicker than other portions and formed to be spherical. Between the fore end of the connecting terminal 112a and the bottom of the connecting section 115, the conductive fluid 5 containing highly dense fine particles of liquid metal is interposed. Most of the Organic liquid contained in the conductive fluid 5 exists in an upper portion of the fore end. Reference numeral 111a is a semiconductor element (circuit element), and reference numeral 113a is a ceramic circuit board. In this connection, in FIG. 10(a), like reference numerals are used to indicate like parts throughout FIGS. 9(a) to 9(b) and 9(c).

In the other example, as illustrated in FIG. 10(b), a fore end of the connecting terminal 112b is thin, and an intermediate portion is thick. The conductive fluid 5 containing highly dense fine particles of liquid metal is interposed between the thick intermediate portion of the connecting terminal 112b and the bottom of the connecting section 115. Accordingly, the fore end portion of the connecting terminal 112b is inserted into the conductive fluid 5 containing highly dense fine particles of liquid metal. Most of the Organic liquid in the conductive fluid 5 mainly exists in an upper portion located higher than the fore end portion. Reference numeral 111b is a semiconductor element (circuit element), and reference numeral 113b is a ceramic circuit board. In this connection, in FIG. 10(b), like reference numerals designate the same parts throughout FIGS. 9(a) to 9(c).

Next, an electrical connection will be explained below, in which the connecting terminals 112 of the circuit board 113 are inserted into the connecting sections 115 of the electrical connecting device (connector base body) 114, and the circuit board 113 and the electrical connecting device 114 are electrically connected.

First, the connecting terminals 112a, 112b on the circuit boards 113a, 113b are positioned at the recessed connecting sections 115 of the connector base body 114. Next, the connecting terminals 112a, 112b are lowered so as to be contacted with the conductive fluid 5, and further the connecting terminals 112a, 112b are pushed. At this time, small gaps are formed between the connecting terminals 112a, 112b and the inner walls of the connecting sections 115. Due to the small gaps, the conductive fluid 5 cannot move upward, so that a pressure is given to the conductive fluid 5. Therefore, the fine particles of liquid metal contained in the organic liquid are pushed downward, so that the density is increased on the lower side.

Further, as the force given to the connecting terminals 112a, 112b is increased, the pressure of the conductive fluid 5 is increased since the movement of the conductive fluid 5 is restricted by the small gaps. Therefore, the organic liquid, the fluidity of which is high, mainly oozes out from the gaps on the side wall formed between the connecting terminals 112a, 112b and the inner wall of the recessed connecting sections 115. In this way, the connecting terminals 112a, 112b are inserted into the conductive fluid 5.

While the force is given, the contact terminals 112a, 112b are inserted and finally stopped in the connecting sections 115. At this time, the conductive fluid 5 containing fine particles of liquid metal is interposed between the small gap and the bottom of the connecting section 115.

In this connection, when the pins 112b shown in FIG. 10(b) are used, the fore ends of which are thin, and the intermediate portions of which are thick, the fore end portions are inserted into the conductive fluid 5 containing highly dense fine particles of liquid metal.

Due to the foregoing, the conductivity between the connecting terminals 112a, 112b and the connecting wiring patterns 116, 117 positioning at the bottom of the recessed connecting sections 115 is further enhanced, and the connecting resistance is further reduced.

In some cases, the pressurization described above is attained by the weight of the circuit boards 113a, 113b.

Next, the results of measurement of electrical connecting resistance will be explained below when the connecting terminals 112a are inserted into the connecting sections.

The connecting terminal 112a to be measured was constructed in the following manner. A fore end of the connecting terminal 112a was formed to be spherical, the diameter of which was 685 μm, and other portions of the connecting terminal 112a were composed of a pin made of gold (Au) or gold plated Ni or phosphorus bronze, the diameter of which was 200 to 300 μm. In order to make a comparison, a straight pin as shown in FIGS. 9(b), (c), the diameter of which was 200 to 300 μm, was used as well.

Ga—Sn liquid metal having the eutectic composition of 92.0 wt % Ga and 8.0 wt % Sn was used as the liquid metal, and silicone oil was used as the organic liquid. These were mixed and stirred with a homogenizer 4 so that the conductive fluid 5a containing dispersed fine particles of liquid metal therein was made.

A method of measuring the electrical connecting resistance will be explained with reference to FIG. 11. FIG. 11 is an arrangement view of the measuring apparatus.

First, a cylindrical insulating wall 121 was fixed by means of adhesion onto an electrode A made of copper (Cu). Therefore, the electrode A was formed at the bottom of the cylindrical insulating wall 121. The conductive fluid 5a made before was accommodated inside this cylindrical insulating wall 121. A measuring terminal A communicated with the electrical resistance meter 122 was connected with the electrode A by means of soldering.

The aforementioned connecting terminal 112a was mounted on an electrode B while electrical communication was ensured between the connecting terminal 112a and the electrode B. A measuring terminal B communicated with the electrical resistance meter 122 was connected with the electrode B by means of soldering. In this connection, in order to avoid the influence of contact resistance, the measuring terminals A and B were respectively divided into a current carrying terminal and a voltage measuring terminal.

A spherical end of this connecting terminal 112a was dipped in the conductive fluid 5a accommodated inside of the cylindrical insulating wall 121. While a force was given, the connecting terminal 112a was inserted into the cylindrical insulating wall 121, and when the connecting terminal 112a was stopped, the electrical resistance was measured between the electrodes A and B.

The result of measurement is described as follows. When a thin connecting terminal, the diameter of which was constant, was used, the resistance was 100 to 200 mΩ. On the other hand, when the connecting terminal 112a, the fore end of which was thick and formed to be spherical, was used, the resistance was 0 to 30 mΩ.

When the conductive fluid 5a is pressurized as described above, the density of fine particles of liquid metal contained in the conductive fluid 5a is increased, and the resistance of the conductive fluid 5a is reduced. Due to the foregoing, even if an amount of liquid metal contained in the conductive fluid 5a in the initial stage is small, it is possible to obtain a connecting resistance suitable for practical use when the conductive fluid 5a is pressurized and the connecting terminal 112a is inserted. Accordingly, it is possible to extend a range of the liquid metal content.

As described above, according to the electrical connecting conductor of the present invention, the fine particles of liquid metal dispersed in the organic liquid are contacted with each other. Therefore, the resistance of the liquid metal itself is reduced, and a stable electrical communication can be provided between the connecting terminal and the connecting wiring patterns of the connecting section.

When the liquid metal is dispersed in the organic liquid, the liquid metal is not contacted with the outside air. Accordingly, it is possible to prevent the occurrence of oxidization or hydroxidization of the liquid metal.

According to the electrical connecting device of the present invention, the connecting terminal 112a is inserted into the cylindrical connecting section 121 having a bottom in which the conductive fluid is accommodated, and the connecting terminal 112a and the connecting section are electrically connected through the conductive fluid. Therefore, a force required for insertion and withdrawal of the connecting terminal is substantially zero.

Also, since the connecting terminal is covered with fine particles of the liquid metal contained in the conductive fluid, the contact area is larger than that of a case in which the conventional mechanical connecting system is used or the contact area is larger than that of a case in which metallic powder is dispersed in the organic liquid. As a result, even if the connecting terminal is minute, the connecting terminal and the connecting section can be electrically connected in a stable condition.

In the electrical circuit device of the present invention, the smallest gap formed between the outer circumferential surface of the connecting terminal dipped in the conductive fluid and the side wall inside of the connecting section is maintained to be not less than 10 µm and not more than 50 µm i.e., the gap is maintained to be 10–50 µm.

Since the gap formed between the connecting terminal and the side wall inside of the connecting section is small, pressure is applied to the conductive fluid when the connecting terminal is inserted into the connecting section. Accordingly, when the connecting terminal is stopped at the final inserting position, the conductive fluid containing highly dense fine particles of liquid metal is interposed between the small gap portion and the bottom of the connecting section. Due to the foregoing, the conductivity between the connecting terminal and the connecting section is further increased, so that the connecting resistance is further reduced.

Figure 12:
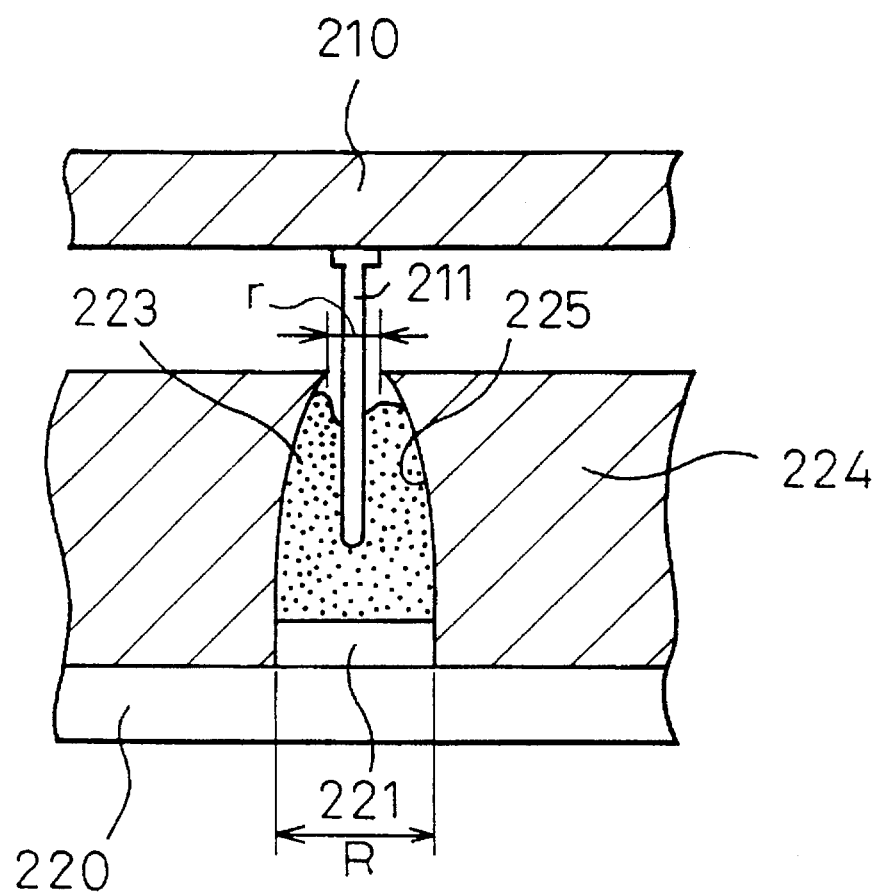
FIG. 12 is an enlarged sectional view showing a hole in the circuit board in which the conductive fluid is accommodated.

FIG. 12 is an enlarged cross-sectional view showing a hole of the circuit board in which the conductive fluid is filled. In FIG. 12, a first circuit board 210 has a plurality of electrodes or input/output terminals 211, only one of such electrodes 211 is illustrated in the drawing, extending perpendicularly to the surface of the circuit board 210. A second circuit board or connecting board 220 is provided with a plurality of holes 225 at positions corresponding to the input/output terminals 211 of the first circuit board 210. Such holes 225 are formed on a photosensitive polymer 224 as will be described later in detail.

Although not illustrated in the drawings, one or both of the first and second circuit boards 210 and 220 is provided with electronic components, such as ICs, LSIs, chip condensers, chip resistance or the like, which are electrically connected to the electrodes (A or B) 211 or 221 by means of wiring patterns, not illustrated.

The conductive material 123 can be made as follows. First, the liquid metal (Ga, including 8 weight % of Sn) is mixed with organic liquid, for example silicone oil such as "dimethyl polysiloxane"®. Then, a compound material is obtained by being stirred and mixed by a homogenizer.

Figure 13A:
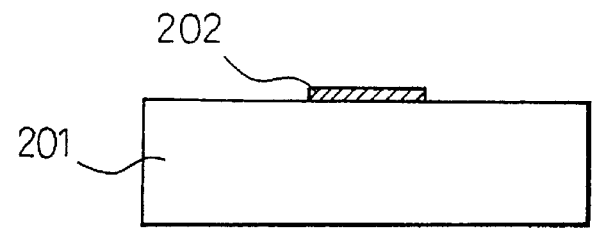
FIGS. 13(a) to 13(d) are sectional views showing a step for forming the hole as shown in FIG. 11
Figure 13B:
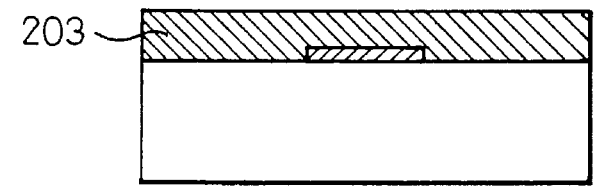
Figure 13C:
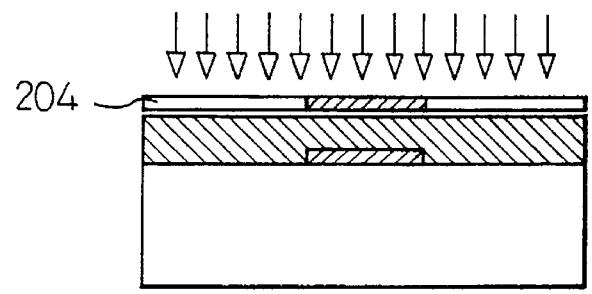
Figure 13D:
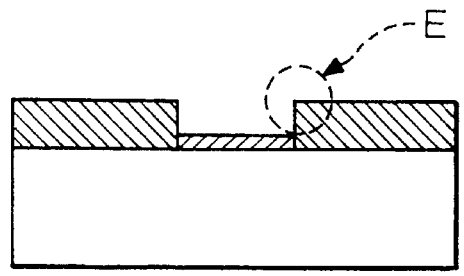

The bottle-shaped hole 225, into which the conductive material 223 is filled, can be formed by a process as shown in FIGS. 13(a) through 13(d). In the first step, as shown in FIG. 13(a), the substrate 201 is partially metallized on which electrodes 202 are formed. That is to say, a highly conductive metal, such as Au or the like, is formed on the substrate by sputtering or the like. In the second step, as shown in FIG. 13(b), a layer of photosensitive polymer 203, such as photosensitive resin, is formed on the metallized substrate by spin coating and then subjected to prebaking, for example at 60° C. for 30 minutes.

The photosensitive resin used here can be defined as follows.

Polyamic acid
+ 2-functional acrylatemonomer (20–30 weight %)
+ radical generator 3,3',4,4'
− Tetra-(tertiary butyldioxycarbonyl)-Benzophenone In the fourth step, using a masking to light shield the portions where the electrodes are formed, a light of 250 mJ (wavelength: 436 nm) from a ultra-high pressure mercury lamp is exposed on the substrate and developed. In the step 5, using a suitable etching liquid, the photosensitive resin at the unexposed, electrode forming portions is removed.

The etching liquid which can be used here contains the following components:

| | |
|---|---|
| N—N'-dimethylacrylamide | 82 wt % |
| Isopropanol | 7 wt % |
| H$_2$O | 11 wt % |

Finally, in the sixth step, the substrate is fired for example at 400° C. for 60 minutes.

Figure 13E:
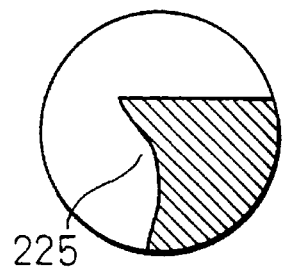
FIG. 13(e) is an enlarged view showing a part of FIG. 13(d).

As the results of the above mentioned conditions, a hole 225 having about 50 µm depth can be obtained, as shown in FIG. 13(e). That is to say, the hole 225 has a bottle or pot shape in which the cross-sectional area thereof at an internal side is larger than that at an open-end thereof (i.e., diameter r<diameter R). Also, the metallized film, i.e., electrode B 221 (FIG. 12), is formed on the bottom of the hole 225.

The above-mentioned conductive material 223 was filled in the hole 225. Then, the pin electrode 211 was repeatedly inserted into the hole 225 and an electrical resistance was measured. As the results of the repeated insertion and removal of the electrodes, the amount of the conductive material 223 was not reduced. Also, the electrical resistance was kept at about 20–30 mΩ.

As mentioned above, according to the present invention, a conductive material 223 in which fluidable fine particles of liquid metal is uniformly spread or dispersed in the organic liquid is used as a material of contacts and such a conductive material 223 is filled in the bottle or pot-shaped hole 225 having a relatively narrow inlet opening. Thus, the conductive material 223 can be safely kept within the bottle or pot-shaped hole 225 and cannot easily spilled or scattered out of the hole. Thus, a reduction of conductive material can be prevented for a long time period. Thus, an electrical connecting device can be obtained, in which the force or strength of insertion or removal can be greatly reduced, using the above mentioned contact material.

We claim:

1. An electrical connecting conductor for electrically connecting different terminals, comprising a conductive fluid in which liquid metal and an organic liquid are stirred and a particulate liquid metal is mixed with the organic liquid.

2. The electrical connecting conductor according to claim 1, wherein the liquid metal is a Ga—Sn alloy.

3. The electrical connecting conductor according to claim 2, wherein the liquid metal is a Ga—Sn alloy having the eutectic composition of 92.0 wt % of Ga and 8.0 wt % of Sn.

4. The electrical connecting conductor according to claim 1, wherein the liquid metal is a Ga—In alloy.

5. The electrical connecting conductor according to claim 4, wherein the liquid metal is a Ga—In alloy having the eutectic composition of 75.5 wt % of Ga and 24.5 wt % of In.

6. The electrical connecting conductor according to claim 1, wherein the organic liquid is perfluorocarbon oil, silicone oil or hydrocarbon.

7. An electrical connecting device comprising a connecting section provided with a bottom in which the conductive fluid according to claim 1 is accommodated and the connecting section is electrically connected with an inserted connecting terminal through the conductive fluid.

8. An electrical circuit device according to claim 7 in which a connecting terminal on the circuit board is inserted into the cylindrical connecting section having the bottom, the conductive fluid being accommodated in the cylindrical connecting section, wherein a minimum interval between the outer circumferential surface of the connecting terminal dipped in the conductive fluid and the inside wall of the connecting section is 10 to 100 μm.

9. The electrical circuit device according to claim 8, wherein a fore end of the connecting terminal dipped in the conductive fluid in the connecting section is formed spherical, and the width of the connecting terminal is maximum at the fore end.

10. The electrical circuit device according to claim 8, wherein a fore end of the connecting terminal dipped in the conductive fluid in the connecting section is thin and an intermediate portion of the connecting terminal dipped in the conductive fluid is thick.

11. An electrical connecting device comprising:

a first circuit board being provided thereon with input/output terminals;

a second circuit board being provided with holes at positions corresponding to said input/output terminals of said first circuit board, each of said holes having a bottle shape in which the cross-sectional area thereof at an internal side is larger than that at an open-end thereof; and conductive material filled in each of said holes, wherein said first and second circuit boards are electrically connected to each other by inserting said input/output terminals of said first circuit board into the respective holes of said second circuit board, wherein said conductive material is a liquid metal, and wherein said conductive material is in liquid state at room temperature.

12. An electrical connecting device, comprising:

a first circuit board being provided thereon with input/output terminals;

a second circuit board being provided with holes at positions corresponding to said input/output terminals of said first circuit board, each of said holes having a bottle shape in which the cross-sectional area thereof at an internal side is larger than that at an open-end thereof; and conductive material filled in each of said holes, wherein said first and second circuit boards are electrically connected to each other by inserting said input/output terminals of said first circuit board into the respective holes of said second circuit board, wherein said conductive material is a compound conductive fluid in which particulate liquid metal and an organic liquid are mixed; liquid metal particles are dispersed in an organic liquid.

* * * * *